US009263408B2

(12) United States Patent
Detalle

(10) Patent No.: US 9,263,408 B2
(45) Date of Patent: Feb. 16, 2016

(54) METHOD FOR PRODUCING MICROBUMPS ON A SEMICONDUCTOR COMPONENT

(71) Applicant: IMEC, Leuven (BE)

(72) Inventor: Mikael Detalle, Limal (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/092,796

(22) Filed: Nov. 27, 2013

(65) Prior Publication Data

US 2015/0130052 A1    May 14, 2015

(30) Foreign Application Priority Data

Nov. 8, 2013  (JP) .................................. 2013-232359

(51) Int. Cl.
*H01L 23/48* (2006.01)
*H01L 23/00* (2006.01)
*H01L 23/31* (2006.01)

(52) U.S. Cl.
CPC ................ *H01L 24/14* (2013.01); *H01L 24/11* (2013.01); *H01L 23/3114* (2013.01); *H01L 23/3157* (2013.01)

(58) Field of Classification Search
CPC ...... H01L 24/14; H01L 24/11; H01L 23/3171
USPC .......................... 257/737–738, 780–781, 784
See application file for complete search history.

(56) References Cited

U.S. PATENT DOCUMENTS

| 6,400,021 | B1 | 6/2002 | Cho |
| 7,767,496 | B2 * | 8/2010 | Shim et al. .................... 438/118 |
| 8,405,220 | B1 | 3/2013 | Loeb et al. |
| 2002/0027269 | A1 | 3/2002 | Hashimoto |
| 2004/0070079 | A1 | 4/2004 | Huang et al. |
| 2009/0309216 | A1 | 12/2009 | Jeon et al. |
| 2010/0230811 | A1 | 9/2010 | Shin et al. |
| 2010/0283148 | A1 | 11/2010 | Tsai et al. |

OTHER PUBLICATIONS

Detalle et al., "Interposer Technology for High Band Width Interconnect Applications," IEEE, 2013 Electronic Components and Technology Conference, pp. 323-328.

\* cited by examiner

*Primary Examiner* — Hoa B Trinh
(74) *Attorney, Agent, or Firm* — Knobbe, Martens, Olson & Bear LLP

(57) ABSTRACT

The disclosed technology relates to pillar-type microbumps formed on a semiconductor component, such as an integrated circuit chip or an interposer substrate, and a method of forming the pillar-type microbumps. In one aspect, a method of forming the pillar-type microbump on a semiconductor component includes providing the semiconductor component, where the semiconductor component has an upper metallization layer, and the metallization layer has a contact area. The method additionally includes forming a passivation layer over the metallization layer. The method additionally includes forming a plurality of openings through the passivation layer such that the contact area is exposed at a bottom of the openings. The method further includes forming the microbump over the contact area, where the microbump forms an electrical connection with the contact area through the openings.

7 Claims, 3 Drawing Sheets

METHOD FOR PRODUCING MICROBUMPS ON A SEMICONDUCTOR COMPONENT

CROSS-REFERENCE TO RELATED APPLICATIONS

This application claims foreign priority to Japanese patent application JP 2013-232359 filed on Nov. 8, 2013, the content of which is incorporated by reference herein in its entirety.

BACKGROUND OF THE INVENTION

1. Field of the Invention

The disclosed technology generally relates to packaging of semiconductor components, such as integrated circuit chips, and more in particular to packaging of semiconductor components using pillar-type microbumps.

2. Description of the Related Technology

In systems for high performance applications such as Memory-Logic or Logic-Serializer/Deserializer (SERDES), the packaging technology chosen to interface the semiconductor chips can have a significant impact on the performance of the overall system. Generally, the bandwidth of the interconnections can be improved by increasing the number of Input/Output (I/O) between the chips. To increase the number of I/O in flip-chip/3D packaging technologies, the number of microbumps to interface the chips may correspondingly be increased, for example, by decreasing pitch and dimensions of the microbumps. Pillar-type microbumps (in contrast to solder ball-type) are typically used for forming microbumps having a pitch of 40-50 µm or less. For forming microbumps having smaller pitches (e.g., 20 µm or below), the underlying structures and/or the bump adhesion (affected by the bump diameter reduction) can introduce undesirable topographies on surfaces of the microbumps, which can hinder stacking and cause yield loss and/or reliability degradation. Thus, there is a need to minimize undesirable topographies on surfaces of microbumps that may result due to similar topography that may be present in the underlying structures, such as contact openings.

SUMMARY OF CERTAIN INVENTIVE ASPECTS

The disclosed technology relates to a method of forming pillar-type microbumps on a semiconductor component, such as an integrated circuit chip or an interposer substrate. The disclosed technology also relates to a semiconductor package comprising one or more components obtainable by the method of forming pillar-type microbumps.

In one aspect, a method of forming the pillar-type microbump on a semiconductor component includes providing the semiconductor component, where the semiconductor component has an upper metallization layer, and the metallization layer has a contact area. The method additionally includes forming a passivation layer over the metallization layer. The method additionally includes forming a plurality of openings through the passivation layer such that the contact area is exposed at a bottom of the openings. The method further includes forming the microbump over the contact area, where the microbump forms an electrical connection with the contact area through the openings.

In one embodiment, a plurality of contact openings are provided in a passivation layer that is deposited on the component, so that one bump contacts the metallization of the component through said plurality of openings. Preferably the plurality of openings forms a regular array of small openings. Preferably a contact pad is conformally deposited on said openings before the bump is formed by electroplating. Due to the plurality of openings, flat microbumps can be formed of very low diameter, allowing production of bump arrays having a very low pitch. The openings also increase the shear strength of the individual bumps. The openings preferably have slanted sidewalls.

According to an embodiment, the number and size of the openings and the distance between the openings is chosen so that the topography defined by said openings is substantially not transferred to the upper surface of said microbump.

According to an embodiment, a metal contact layer is conformally deposited on the passivation layer and in the openings, the metal contact layer is patterned to form a metal contact pad covering the contact area and in electrical contact with the contact area and the microbump is formed on said metal contact pad.

Possibly, before producing the microbump, a second passivation layer is deposited on the whole of the metal contact pad, and wherein the second passivation layer is patterned so as to cover the edges of the contact pad, whilst uncovering at least a portion of the openings.

Said openings in the passivation layer preferably have slanted side walls. The angle of said side walls with respect to the plane of the passivation layer may be between 50° and 85°. Said openings may be arranged in a regular pattern. The maximum diameter of the openings as well as the distance between two neighboring openings may be between 0.5 and 4 micron.

According to an embodiment, the upper metallization layer is the last of a stack of Back-end-of-Line (BEOL) metallization layers.

According to an embodiment, the ratio between the volume of the openings in the passivation layer and the volume of the microbump is between 0.1% and 5%.

The invention is equally related to a semiconductor package, comprising a first and second component, with pillar-type microbumps establishing an electrical connection between the two components, wherein at least one of said microbumps contacts one of said components through a plurality of contact openings in a passivation layer. In a package according to the invention, one of said components may be an integrated circuit chip. The openings are essentially vertical openings through the complete thickness of the passivation layer, 'vertical' in the meaning of 'openings from the top surface to the bottom surface and arranged around a central axis, preferably a symmetry axis'. The passivation layer is preferably a layer deposited on un upper metallization layer (preferably the last BEOL layer) of the component, said upper metallization layer comprising a contact area, with the bumps contacting said area through said openings. In other words, the material of the bumps fills the openings, thereby contacting the contact area.

According to an embodiment, said openings have slanted side walls. The angle of said side walls with respect to the plane of the passivation layer may be between 50° and 85°. Said openings can be arranged in a regular pattern. The maximum diameter of the openings as well as the distance between two neighboring openings can be between 0.5 and 4 micron. A contact pad may cover said plurality of openings with a microbump being deposited on said contact pad.

DETAILED DESCRIPTION OF CERTAIN ILLUSTRATIVE EMBODIMENTS

Microbumps are often used in semiconductor packaging, especially where the pitch of such bumps is smaller than about of 40-50 µm or less. When the microbumps are formed, topographies of underlying structures can sometimes cause undesirable topographies on the surfaces of the microbumps formed over the underlying structures, such as contact openings.

Figure 1:
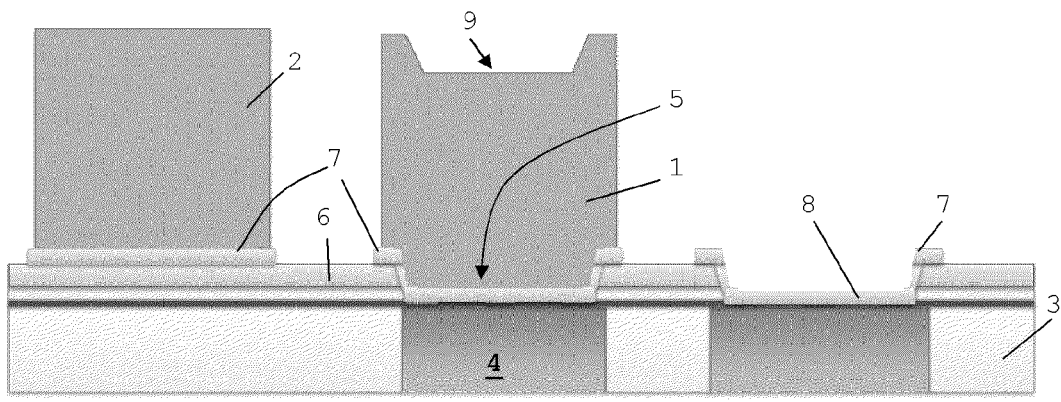
FIG. 1 is a cross-sectional view of a semiconductor component having microbumps formed thereon.

An example of such undesirable topographies is illustrated in FIG. 1, where an active microbump 1 and a dummy bump 2 are shown, on a semiconductor chip 3. The active microbump 1 contacts a metal layer 4 in the upper metallization layer of the chip (commonly known as last Back-end-of-line (BEOL) layer) by a vertical connection, i.e. via a contact opening 5 in the passivation layer 6 that is present on top of the last BEOL layer, whereas the dummy bump 2 is deposited on top of the passivation layer 6. A metal contact layer 7 is typically present between the microbumps 1 and 2 and the chip 3, where the metal contact layer 7 can form a probing pad 8. As illustrated, the topography of the underlying contact opening 5 of the active bump 1 can be transferred to the top of the active bump 1, which can be manifested as a cavity 9, while the dummy bump 2 can have an essentially flat top surface. The dummy bump 2 can also be an active bump without a vertical connection to the last BEOL layer, but connected to a circuit via the metal contact layer 7.

According to an embodiment, a contact surface onto which a pillar-type active microbump is formed, is provided as a plurality of small openings through a passivation layer, instead of as a single large contact opening. According to an embodiment, the number and size of the openings and the distance between the openings is chosen so that the topography defined by said openings is substantially not transferred to the upper surface of the microbump, in other words the upper surface of the bump is substantially flat. The contact openings preferably have slanted sidewalls. The method of the invention is described hereafter according to an embodiment.

Figure 2:
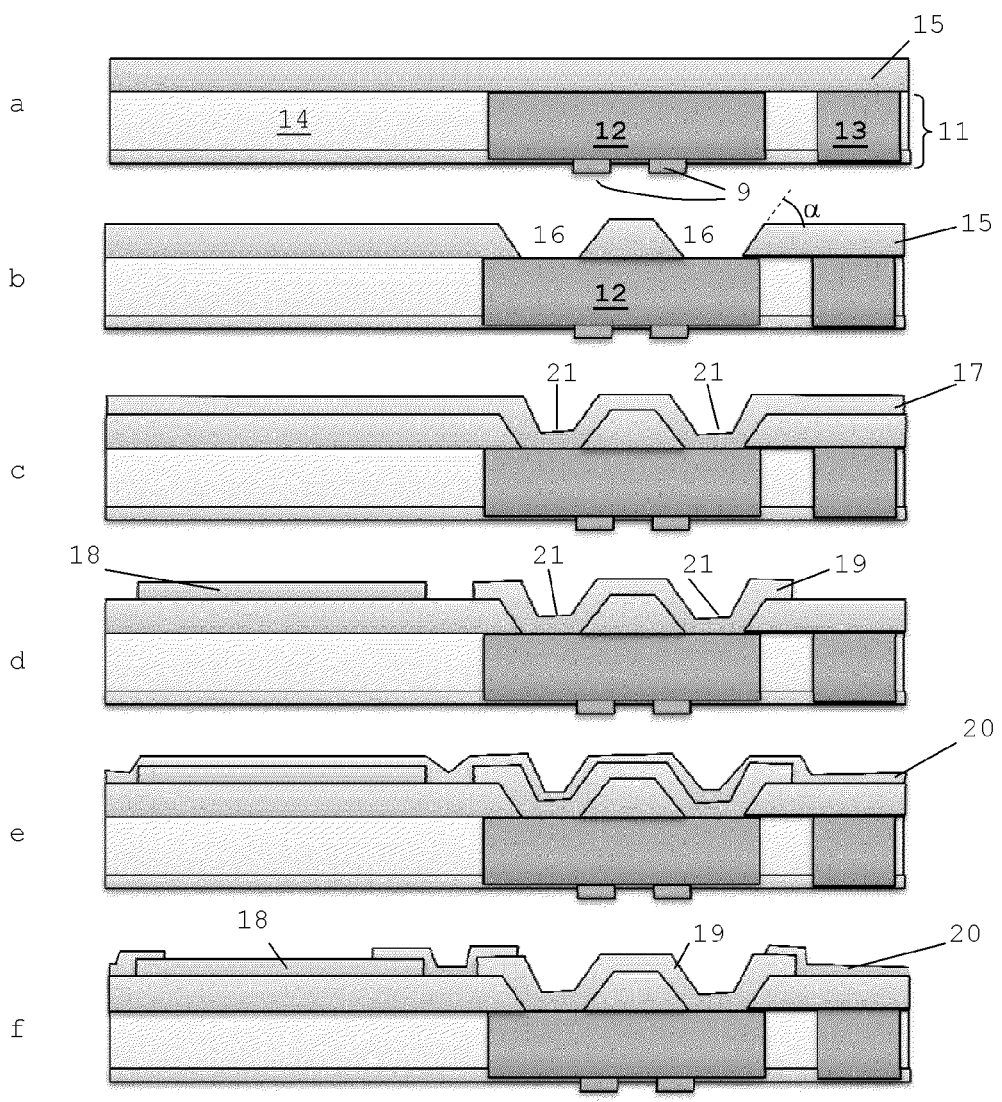
FIGS. 2a-2f are cross-sectional views illustrating a semiconductor component at various stages of forming a contact pad thereon according to some embodiments.

FIG. 2a shows the top metallization layer 11 of an integrated circuit chip, which can be the last BEOL layer, according to an embodiment. This layer comprises metal contact areas 12 and conductor lines 13, embedded in a dielectric layer 14. Metal filled vias 9 (only partially shown) connect the areas 12/13 to underlying metallization layers. No details are described here as to how these metallization layers are formed, as this is considered known by the skilled person. The embodiment described hereafter in detail is a method for producing two pillar type microbumps on the chip, one dummy bump or an active bump without a vertical connection to the BEOL stack, and one active bump, the latter being in electrical contact with the chip's contact area 12 via a vertical connection. As seen in FIG. 2a, a passivation layer 15 is first deposited on the top metallization layer 11. The passivation layer 15 can comprise several sublayers. For example, the passivation layer 15 may comprise a stack including a SiCN layer and a SiCO layer, deposited on the metallization layer 11, which can be followed by a layer of SiO on the SiCN/SiCO layer, which can in turn be followed by a SiN layer on the SiO layer.

Referring to FIG. 2b, using lithography and etch processes known in the art and therefore not described here in detail, a plurality of openings 16 is formed in the passivation layer 15, to thereby expose the contact area 12 at the bottom of said openings, i.e. the openings are vertical openings through the complete thickness of the passivation layer (see meaning of 'vertical' above), according to an embodiment. In some embodiments, a regular array of openings 16 are formed, for example a rectangular array of mutually identical openings at a regular distance from each other. In some embodiments, the openings 16 have slanted sidewalls, as is visible in the drawings. The number of openings provided for each microbump can depend on parameters such as the thickness of the passivation layer, the diameter of the bump and the diameter of the openings as well as the distance between adjacent openings.

In some embodiments, the number of openings for each bump is maximized while taking into account these parameters, in order to maximize the contact and thereby reduce the overall resistance of the current path through the microbumps. This can be beneficial for power consumption and Electro-migration especially in case of high power applications.

Referring to FIG. 2c, after patterning the openings 16, a metal layer 17 is deposited conformally on the passivation layer 15 and the openings 16 according to an embodiment As used herein, a conformal layer refers to a layer that has substantially same thickness over different surfaces that can have different angles, and therefore substantially follows the topography of the underlying structure. In the illustrated embodiment of FIG. 2c, the metal layer 17 is deposited conformally over the openings, such that the topographies of the underlying openings 16 are transferred to cavities 21 formed by depositing the metal layer 17. Because the metal layer 17 is conformal, a step height of the cavities 21 may be substantially the same as a step height of the openings 16. The metal layer 17 may be obtained by a sequence of several deposition processes, for example a Ta deposition process followed by a TiN deposition process and/or an Al deposition process.

Referring to FIG. 2d, after depositing the metal layer 17, another lithography process is performed according to an embodiment. The lithography process is performed to pattern the metal layer 17, thereby obtaining a metal contact pad 18 for the dummy bump and a metal contact pad 19 for the active bump, the latter being provided with said cavities 21.

Referring to FIG. 2e, after patterning the metal layer 17, a second passivation layer 20 is deposited and patterned by a lithography process, according to an embodiment. Depositing and patterning the second passivation layer 20 exposes portions of contact pads 18/19, while leaving the edges of the contact pads covered by the second passivation layer 20. The second passivation layer 20 may be formed of SiN.

Figure 3:
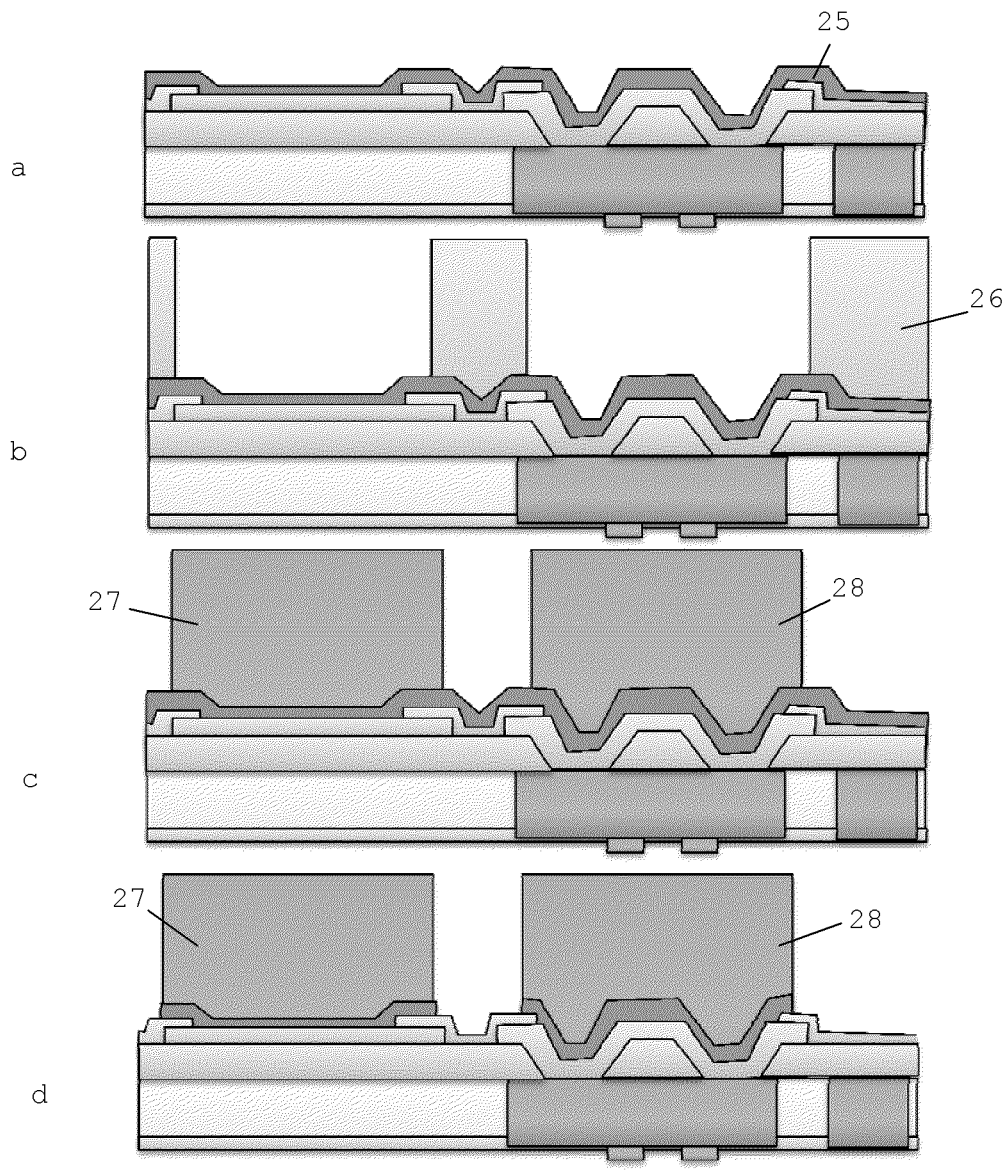
FIGS. 3a-3d are cross-sectional views illustrating a semiconductor component at various stages of forming a microbump on a contact pad according to some embodiments.

The forming of copper pillar-type microbumps on the contact pads 18/19 may take place according to any known process. FIGS. 3a-d illustrates forming of the microbumps according to an embodiment, starting with the deposition of a seed layer 25, for example consisting of a stack of TiW and Cu, as illustrated in FIG. 3a. The seed layer can also be conformal, i.e. it follows the topography of the patterned metal layer 17 in the cavities 21 formed in the original openings 16. Referring to FIG. 3b, using a lithography process, a resist mask 26 is formed on the seed layer, with openings in the mask defining the position of the microbumps. Referring to FIG. 3c, bumps 27 and 28 are then formed by copper plating, after which the mask is removed. Referring to FIG. 3d, the Cu and TiW seed layer is etched, completing the formation of the microbumps, the dummy bump 27 and the active bump 28. Thanks to the contact openings 16, the upper surface of the active bump 28 is substantially flat such that a topography defined by the openings 16 in FIG. 2b is substantially not transferred to an upper surface of the active bump 28. As used herein, a topography is substantially not transferred to an upper surface of the active bump 28 if a difference between a step height of the surface of the active bump 28 and a step height of the surface of the dummy bump 27 is negligible, as illustrated in FIG. 3d.

Some of the above-described steps are optional, such as the deposition of the metal layer 17 and the deposition of the second passivation layer 20.

Figure 4:
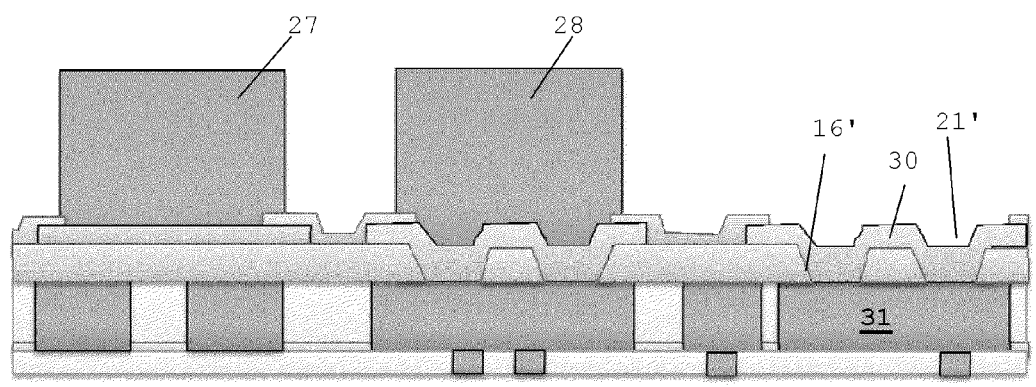
FIG. 4 is a cross-sectional view illustrating a semiconductor component having a probing pad and a contact pad for a microbump, according to some embodiments.

According to an embodiment illustrated in FIG. 4, a probing pad 30 is formed together with the production of the contact pads 18 and 19, during the patterning step of the metal layer 17. Contact openings 16' are provided in the passivation layer 15 to thereby expose the probing pad's contact area 31 in the same way as described above in relation to the contact area 12 and the openings 16. The metal layer 17 is patterned to form the probing pad 30, provided with cavities 21'. The design of the probing pad 30 having the same number and size of cavities 21' as the contact pad 19 is preferable due to the fact that the etch time for etching the openings 16 and 16' is the same. If a larger opening is made in the passivation layer 15 for producing the probing pad, this opening would be etched faster, leading to over-etching this area before the smaller openings 16 are etched. However, when a suitable etch stop layer is provided, the flat probing pad of FIG. 1 can be combined with contact pads 19 according to the illustrated embodiment.

As stated, the openings 16 and 16' preferably have slanted side walls, i.e. the upper cross section in the upper surface of the passivation layer 15 is larger than the lower cross section in the bottom surface of said passivation layer, and the sidewalls are placed at an inclination angle α with respect to the plane of the passivation layer 15 (see FIG. 2b). It is possible that the top of the sidewall of one or more openings, for example the upper 10% of the sidewall height, is slanted at a sharper angle with respect to the passivation layer's plane compared to the majority of the sidewall. In that case the inclination angle of the majority of the sidewall (i.e. the lower portion starting from the bottom of the opening and up to the more sharply inclined upper portion) is to be understood as the angle α of that wall.

The presence of slanted sidewalls in the openings is especially important when a contact layer 17 is deposited before producing the actual microbumps by plating. When the sidewalls are vertical, the metal layer 17 will form an overhang inside the openings 16, thereby making it difficult to produce a seed layer onto the totality of the metal layer 17 in said openings 16, and also causing a risk of voids forming in the openings 16. Depending on the size of the openings 16 and the thickness of the passivation layer 15 into which the openings 16 are etched, the angle α (see FIG. 2b) of the sidewalls with respect to the plane of the passivation layer 15 may be between 50° and 85°.

Microbumps formed according to embodiments have an improved shear strength compared to microbumps formed on a flat contact pad (as shown in FIG. 1). This was experimentally confirmed by tests performed by the inventors on microbumps having a diameter of 7.5 micron, and formed according to an embodiment, i.e. on contact pads 19 having cavities 21, in comparison to the same bumps formed on flat contact pads. It was found that the shear strength improved by about 48% compared to the flat contact pad, when this pad is replaced by a contact pad 19 deposited on a rectangular array of openings 16 in the passivation layer 15 having a maximum diameter (i.e. diameter at the top of the slanted sidewalls) and mutual distance (i.e. distance between two neighbouring openings in the same row) of 1 micron. For an array of 2 micron-openings at a mutual distance of 2 micron, the improvement is more than 100%. According to an embodiment, the maximum diameter (i.e. in the upper surface of the passivation layer) as well as the mutual distance is between 0.5 and 4 micron.

The cross section of the openings 16/16' in the plane of the passivation layer 15 may be polygonal or circular. In the case of a polygonal shape, the 'diameter' is defined as the diameter of the circle into which the polygon is inscribed, or the maximum distance between two points on the polygon.

Whether or not the topography of the openings is transferred to the top of the bump depends on the number and size of the openings, the distance between the openings, and the thickness of the layers that are deposited in the openings before the actual bump deposition takes place (for example metal layer 17 and seed layer 25). According to an embodiment, the ratio between the volume of all the openings 16 upon which the bump is deposited and the volume of the bump is between 0.1% and 5%. A more preferred range is 0.1% to 2%. A further preferred range is 0.1% to 1%.

The invention is equally related to a semiconductor package, comprising a first and second component, with pillar-type microbumps establishing an electrical connection between the two components, wherein at least one of said microbumps contacts one of said components through a plurality of contact openings 16 in a passivation layer 15. In other words, at least one of said microbumps is obtainable by the method of the invention. Specific embodiments of the package of the invention are characterized by any of the features as described above with respect to the method in as far as these features can be recognized in the package, i.e. slanted sidewalls of the openings, rectangular array of openings, size of openings, etc. The first component may be an integrated circuit chip and the second an interposer substrate even though any combination of components is possible within the scope of the invention. With the method of the invention, rows of microbumps can be formed at a small pitch, and without the topography problems described above, whilst maintaining high shear strength.

Numerical Example

Figure 5:
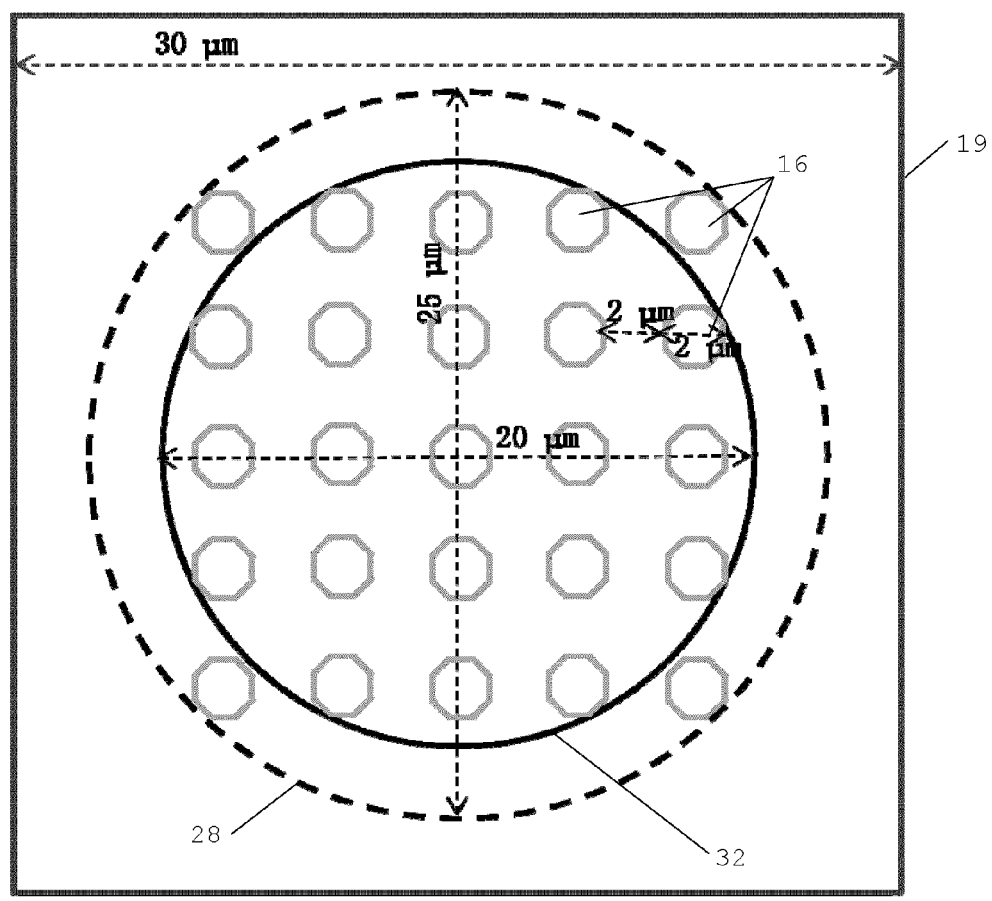
FIG. 5 is a top-down view illustrating a geometrical layout of a contact area for a microbump according to some embodiments.

FIG. 5 shows a top view of the active microbump 28, and an indication of possible sizes of the various areas. These sizes are given by way of example only. The openings have the shape of a regular octagon in the plane of the passivation layer. The indicated size (maximum diameter of slightly more than 2 micron) and number of the openings 16 in the passivation layer 15 and the distance between neighbouring openings in the same row of the array (2 micron), is capable of ensuring that a microbump with a diameter of 25 micron, deposited on top of a metal contact pad 19 deposited conformally on said openings, does not shown any discernible upper topography. The other features that are visible in this figure are the circumference of the metal contact pad 19 and the circular contact opening 32 formed in the 2nd passivation layer 20.

The thickness of the passivation layer 15 in this example is about 0.8 micron and the angle of the sidewalls of the openings 16 with respect to the plane of the passivation layer is about 72°. These 25 micron-diameter bumps allow to build microbump arrays with low pitch, e.g. 40 micron. However, the invention is applicable down to much lower bump diameters of for example about 7 micron, allowing to build bump arrays with a pitch of 20 micron and below. Whereas microbumps of this size encountered the topography problem described in the introduction, bumps formed according to the method do not suffer from this problem.

The following details are given in order to complete the example:

deposition of the passivation layer 15 is done by subsequent PECVD (Plasma Enhanced Chemical Vapour Deposition) deposition of a layer of SiCN (5 nm), a layer of SiCO (25 nm), a layer of SiO (600 nm) and a layer of SiN (200 nm).

The metal layer 17 is formed by subsequent deposition by PVD, of Ta (25 nm), TiN (30 nm) and Al (500 nm).

The second passivation layer 20 is a SiN layer of 30 nm thick, deposited by PECVD. The seed layer 25 is formed of a 30 nm TiW and a 150 nm Cu layer, deposited by PVD.

A number of process steps not mentioned above can be applied according any known suitable technique, for example the litho/etch to pattern the metal layer 17 and the 2nd passivation layer 20, or the litho/etch recipe for producing the openings 16 with slanted side walls having a given angle α. The method may comprise additional steps not explicitly mentioned above but known to the skilled person, for example cleaning steps required before litho/etch.

Taking into account the thickness of the passivation layer and the size of the openings 16 and taking into account that the deposited volume of copper in the electrodeposition is about 4900 $\mu m^3$ (corresponding to a bump of diameter 25 micron and height of 10 micron deposited on a flat surface), the ratio between the volume of the 21 openings 16 onto which the bump is deposited and the bump volume is about 0.9%.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

Unless specifically specified, the description of a layer being deposited or formed 'on' another layer or substrate, includes the options of said layer being formed or deposited directly on, i.e. in contact with, said other layer or substrate, and said layer being formed on one or a stack of intermediate layers between said layer and said other layer or substrate.

What is claimed is:

1. A semiconductor package, comprising:
   a first component;
   a second component; and
   a plurality of pillar-type microbumps forming an electrical connection between the first and second components,
   wherein at least one of the plurality of microbumps contacts at least one of the first and second components through a plurality of contact openings formed through a passivation layer.

2. The semiconductor package of claim 1, wherein the openings have slanted side walls.

3. The semiconductor package of claim 2, wherein the slanted side walls and a plane of the passivation layer forms an angle between about 50° and about 85°.

4. The semiconductor package of claim 1, wherein the openings are arranged in a regularly repeating pattern.

5. The semiconductor package of claim 1, wherein each of the maximum diameter of the openings and the maximum distance between two neighboring openings is between about 0.5 μm and about 4 μm.

6. The semiconductor package of claim 1, further comprising a contact pad covering the plurality of contact openings, wherein one of the microbumps are formed on the contact pad.

7. The semiconductor package of claim 1, wherein one of the first and second components is an integrated circuit chip.

* * * * *